(12) United States Patent
Lupan

(10) Patent No.: US 10,535,579 B2
(45) Date of Patent: Jan. 14, 2020

(54) POWER SEMICONDUCTOR DEVICE AND PACKAGE

(71) Applicant: Sabin Lupan, Katy, TX (US)

(72) Inventor: Sabin Lupan, Katy, TX (US)

( * ) Notice: Subject to any disclaimer, the term of this patent is extended or adjusted under 35 U.S.C. 154(b) by 0 days.

(21) Appl. No.: 16/298,483

(22) Filed: Mar. 11, 2019

(65) Prior Publication Data

US 2019/0311967 A1 Oct. 10, 2019

Related U.S. Application Data

(63) Continuation-in-part of application No. 15/947,756, filed on Apr. 6, 2018, now Pat. No. 10,229,861.

(51) Int. Cl.

| | |
|---|---|
| *H01L 23/52* | (2006.01) |
| *H01L 23/367* | (2006.01) |
| *H01L 23/498* | (2006.01) |
| *H01L 27/088* | (2006.01) |
| *H01L 23/50* | (2006.01) |
| *H02M 1/08* | (2006.01) |

(52) U.S. Cl.
CPC ...... *H01L 23/367* (2013.01); *H01L 23/49844* (2013.01); *H01L 23/50* (2013.01); *H01L 27/088* (2013.01); *H02M 1/08* (2013.01)

(58) Field of Classification Search
CPC ..... H01L 29/66734; H01L 2224/49175; H01L 29/7811; H01L 2224/97; H01L 29/0676; H01L 29/0692; H01L 21/76; H01L 25/072; H01L 23/31; H01L 23/367

USPC ................................ 257/691, 723, 724, 707
See application file for complete search history.

(56) References Cited

U.S. PATENT DOCUMENTS

| | | | | |
|---|---|---|---|---|
| 6,933,593 B2* | 8/2005 | Fissore | ............. | H01L 23/49861 257/666 |
| 8,076,183 B2* | 12/2011 | Xue | .................... | H01L 21/4842 438/123 |
| 10,229,861 B2* | 3/2019 | Lupan | .................... | H01L 23/367 |
| 2008/0272484 A1* | 11/2008 | Myers | .................. | H01L 23/473 257/714 |
| 2009/0130799 A1* | 5/2009 | Havanur | ........... | H01L 23/49562 438/109 |

* cited by examiner

*Primary Examiner* — S. V. Clark
(74) *Attorney, Agent, or Firm* — Lyman Moulton, Esq.

(57) ABSTRACT

A power semiconductor device and package includes multiple electrically parallel semiconductor device legs designed to share source regions and share a drain region between two devices in each leg laterally staggered from each other to distribute thermal conductivity across the shared source regions. A multitude of jigsaw patterned lateral isolation trenches are formed in a substrate of the device. The trenches are configured to isolate the laterally staggered line-in and line-out source regions from a common drain region of the plurality of semiconductor device legs. The staggered devices are also designed for staggered time and staggered heat conductivity delays and current spreading from the package input to an output of a respective pair of devices to improve current and heat conductivity from the package input to an output of a subsequent pair of devices.

20 Claims, 3 Drawing Sheets

POWER SEMICONDUCTOR DEVICE AND PACKAGE

CROSS-REFERENCE TO RELATED APPLICATION

This application claims priority to earlier filed U.S. Provisional patent application 62/482,407 filed Apr. 6, 2017 by Sabin Lupan and U.S. Non-provisional patent application Ser. No. 15/947,756, now U.S. Pat. No. 10,229,861 filed Apr. 6, 2018 also by Sabin Lupan, each incorporated herein by reference in its entirety.

BACKGROUND OF THE INVENTION

Power semiconductor devices are used extensively in power converters to raise or lower a DC voltage to another level (buck or boost), convert AC power to DC power (rectification), and convert DC power to AC power (inversion). They are also increasingly being used in electrical circuit breakers including solid-state circuit breakers (SSCB) to control the distribution of electrical power, protect electrical loads, and isolate faults and other unacceptable overload conditions. Power semiconductors are capable of switching OFF in a matter of microseconds. In contrast, air-gap circuit breakers typically take several milliseconds to respond to and isolate a fault. The fast reaction time offered by solid-state circuit breakers is highly desirable since it can prevent damage to line equipment and electrical loads when a fault occurs, reduce the risk of electrical fires, and prevent arc flashes from occurring.

Although the fast reaction capability of power semiconductor devices is desirable, various problems arise in their deployment in circuit breakers. These problems relate to differences in how the power semiconductor devices are controlled to operate in solid-state circuit breakers, compared to how they are controlled to operate in power converters, and the manner by which power semiconductor devices are typically packaged. Also, different functions of SSCB protection and converters require higher reliability and faster replacement in case of device failure.

Power semiconductor devices in power converters are often controlled to operate as switches (i.e., in "switch-mode") and switching is coordinated among the various power semiconductor devices that make up the converter so that conduction losses ($i^2R$ losses) and switching losses are minimized. In contrast, in solid-state circuit breakers the power semiconductors remain ON during normal operating conditions and are switched OFF only when a fault or other unacceptable overload condition occurs. This application-dependent difference in how the power semiconductor devices are controlled to operate results in different heat generating mechanisms and heat transfer requirements.

So that power semiconductor devices are not damaged or destroyed due to excessive heat and are able to continue operating at a temperature below the maximum permissible operating temperature specified by the manufacturer, it is imperative that the heat generated by the power semiconductor devices be transferred away as efficaciously as possible. The ability to transfer heat away from power semiconductor devices is determined in large part by their packaging. Unfortunately, the packaging used for power semiconductor devices is normally specifically designed and constructed for power converter applications and is inadequate to satisfy the heat transfer requirements needed for circuit breaker applications.

Conventional power semiconductor device packaging is also mechanically vulnerable when used in a solid-state circuit breaker since the power semiconductor devices must be able to withstand significantly higher currents, particularly when a short circuit occurs in the load circuit that the circuit breaker is serving to protect. Although the power semiconductor device in a solid-state circuit breaker is switched OFF after or when a short circuit occurs based on di/dt and amplitude and not peak short circuit current. There is a brief period of time that the device remains ON until it can be switched OFF either for current protection coordination (controlled), or due to avalanche breakdown (uncontrolled). During this time, the power semiconductor device and packaging must pass and withstand thousands and even tens of thousands of amps.

Unfortunately, conventional power semiconductor device packaging is not normally able to withstand these high currents and heat that is generated. The high currents and extreme thermal cycling also leads to die-substrate tension, which can cause physical separation of the power semiconductor die from the packaging substrate, and de-bonding of conductive layers from the packaging substrate. Moreover, since conventional power semiconductor packaging typically uses bonding wires to connect the power semiconductor die pads to conductive traces on the packaging substrate, the significantly higher currents and extreme thermal cycling causes bonding wire fatigue and wire-bond-related package failure. Other unaddressed concerns in the art include thermal cycling at 100-120 Hz most likely to impact wire bonding packages.

SUMMARY OF THE INVENTION

A power semiconductor device and package unit includes a first semiconductor pair of devices configured between a first and a second source region. The pair of devices share a drain region wherein a source portion of the first pair of devices is laterally adjacent a drain portion of a second pair of devices. The first pair of devices is laid out laterally diagonal from the second pair of devices to distribute thermal conductivity relative to an input and an output of the device package. A stair case patterned of lateral isolation trenches is formed in a substrate of the package. The trenches are configured to isolate the laterally diagonal source regions from a common drain region of the first and the second semiconductor pair of devices.

A power semiconductor device and package includes multiple electrically parallel semiconductor device legs configured to share a line-in and a line-out source region and share a drain region between two devices in each leg, wherein each leg is laterally staggered from each other leg to distribute thermal conductivity across the shared source regions. A multitude of jigsaw patterned lateral isolation trenches are formed in a substrate of the device. The trenches are configured to isolate the laterally staggered line-in and line-out source regions from a common drain region of the plurality of semiconductor device legs.

A power semiconductor device and package are designed for staggered time and heat conductivity delays from the package input to an output of a first pair of devices to be shorter than a time and heat conductivity delay from the package input to an output of a second pair of devices. The staggered time and heat conductivity delays from the package input to an output of the second pair of devices is shorter than the delays from the package input to an output of the third pair of devices.

Other aspects and advantages of embodiments of the disclosure will become apparent from the following detailed description, taken in conjunction with the accompanying drawings, illustrated by way of example of the principles of the disclosure herein.

Figure 1A:
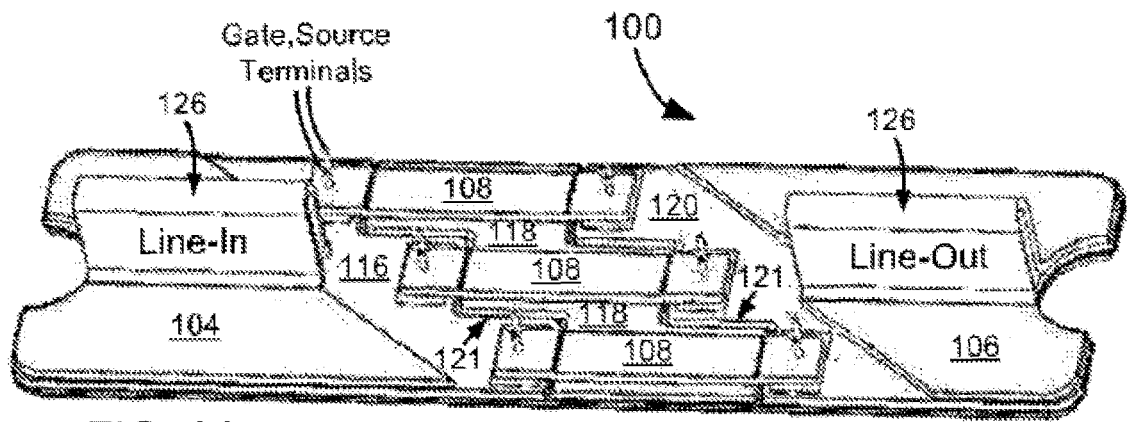
FIG. 1A is a perspective view of the power semiconductor device and package in accordance with an embodiment of the present disclosure.

Throughout the description, similar and same reference numbers may be used to identify similar and same elements in the several embodiments and drawings. Although specific embodiments of the invention have been illustrated, the invention is not to be limited to the specific forms or arrangements of parts so described and illustrated. The scope of the invention is to be defined by the claims appended hereto and their equivalents.

DETAILED DESCRIPTION

Reference will now be made to exemplary embodiments illustrated in the drawings and specific language will be used herein to describe the same. It will nevertheless be understood that no limitation of the scope of the disclosure is thereby intended. Alterations and further modifications of the inventive features illustrated herein and additional applications of the principles of the inventions as illustrated herein, which would occur to a person of ordinary skill in the relevant art and having possession of this disclosure, are to be considered within the scope of the invention.

Figure 1B:
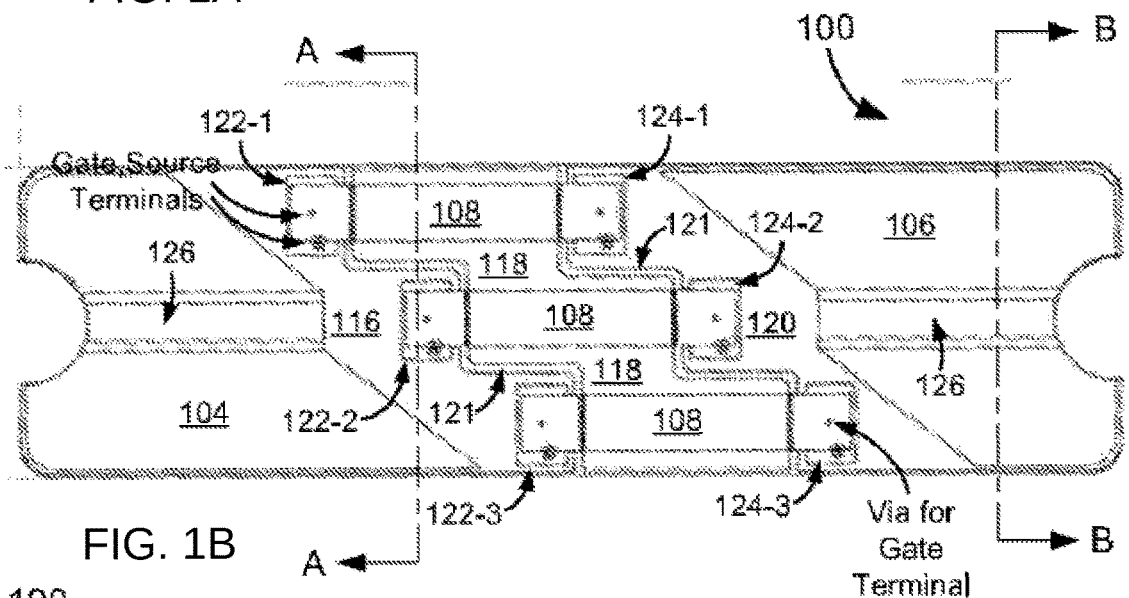
FIG. 1B is a top plan view of the power semiconductor device and package in accordance with an embodiment of the present disclosure.
Figure 1C:
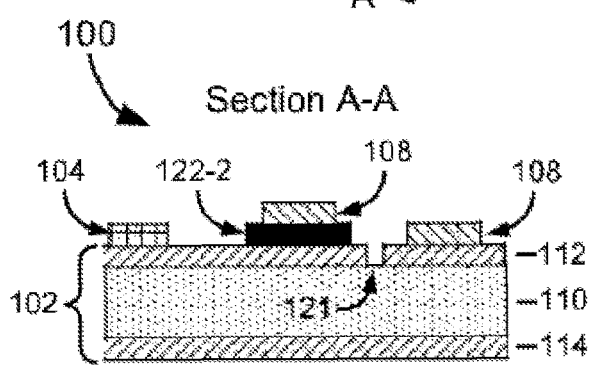
FIG. 1C is a sectional view of the power semiconductor device package 100 along section lines A-A in accordance with an embodiment of the present disclosure.
Figure 1D:
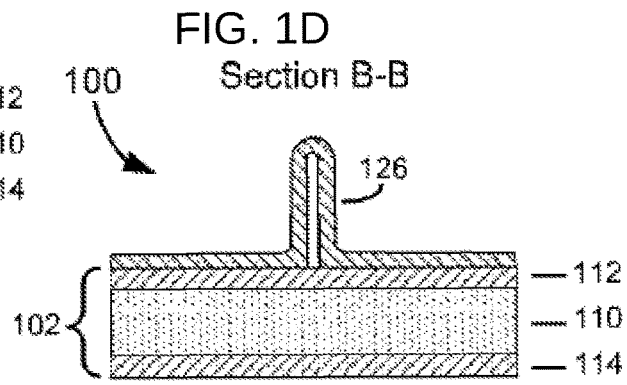
FIG. 1D is a sectional view of the power semiconductor device package 100 along section lines B-B in accordance with an embodiment of the present disclosure.

Referring to FIGS. 1A-D, there is shown an exemplary power semiconductor device and package 100, according to one embodiment of the invention. FIG. 1A is a perspective view of the power semiconductor device package 100. FIG. 1B is a plan (i.e., top) view of the power semiconductor device package 100. FIGS. 1C and 1D are sectional views of the power semiconductor device package 100 along section lines A-A and B-B, respectively.

The power semiconductor device package 100 is specifically designed and constructed for solid-state circuit breakers used in electrical power distribution systems, but may also be used in other applications, including in power converter needs, if desired.

Salient features of the power semiconductor device package 100 include a multilayered substrate 102; line-in and line-out terminals 104 and 106; and conductive clips 108. In one embodiment of the invention, the multilayered substrate 102 comprises a tri-layer substrate that includes a thermally conductive ceramic middle layer 110 sandwiched between top and bottom conductive metal layers 112 and 114. The multilayered substrate 102 may be a direct bond copper (DBC) substrate but is preferably an active metal brazed (AMB) substrate comprised of a silicon nitride ($Si_3N_4$) middle layer 110 and top and bottom copper.

(Cu) layers 112 and 114 are included. Silicon nitride has a high thermal conductivity and metal brazing allows the top and bottom copper layers 112 and 114 to be made thicker than can be realized from conventional DBC manufacturing processes. The silicon nitride middle layer 110 and thick copper layers 112 and 114 thus provide a material combination that is optimal for circuit breaker applications. In particular, the silicon nitride AMB substrate 102 exhibits a thermal cycle performance that is far superior to other more conventional substrate approaches.

As can best be seen in FIGS. 1A and 1B, the top metal layer 112 is patterned into left, central, and right regions 116, 118, and 120, with trenches 121 that electrically separate the central region 118 from the left and right regions 116 and 120. Large left and right metal masses (e.g., Cu), which form the line-in and line out terminals 104 and 106, are eutectically bonded to the left and right regions 116 and 120. The bottom surfaces of power semiconductor die 122-1, 122-2 and 122-3 are soldered or sintered (preferably silver (Ag) sintering) to the left region 116, and the bottom surfaces of power semiconductor die 124-1, 124-2 and 124-3 are soldered or sintered to the right region 120. Each power semiconductor dice in this exemplary embodiment of the invention is a silicon carbide (SiC) power metal-oxide-semiconductor field-effect transistor (MOSFET), with the bottom surface of each dice forming the SiC MOSFET's drain. SiC MOSFETs are employed in this exemplary embodiment since they have low ON resistances, are able to withstand high currents, and have excellent thermal transport properties. However, other types of power semiconductor devices could be used, as will be appreciated and understood by those of ordinary skill in the art.

In the exemplary embodiment of the invention described here, the three SiC MOSFETs 122-1, 122-2 and 122-3 that are bonded to left top metal region 116 are electrically connected in parallel and the SiC MOSFETs 124-1, 124-2 and 124-3 that are bonded to right top metal region 120 are also electrically connected in parallel. The parallel connection of the SiC MOSFETs provides the packaged assembly the ability to withstand the very large currents that can arise in circuit breaker applications, particularly from the time a short circuit first occurs before the SiC MOSFETs can be switched OFF to isolate the short circuit. The upper surface of each SiC MOSFET also includes source and gate pads. The conductive clips 108, which may be copper (Cu), aluminum (Al), or other electrically conductive metal alloy or material are bonded to the SiC MOSFET source pads, to thereby electrically connect the source of the SiC MOSFET 122-1 to the source of SiC MOSFET 124-1, the source of the SiC MOSFET 122-2 to the source of SiC MOSFET 124-2, and the source of the SiC MOSFET 122-3 to the source of SiC MOSFET 124-3.

The regions of the conductive clips 108 directly above the semiconductor die are electrically connected to source pads on the upper surface of the SiC MOSFET die, and source terminals extend vertically from the top surfaces of the conductive clips 108. Gate terminals that are electrically attached to gate pads on the upper surfaces of the SiC MOSFET extend vertically from gate pads on the surfaces of the SiC MOSFETs and through vias formed through the conductive clips 108. The vias also electrically isolate the gate terminals from the source terminals. The vertically extending gate and source terminals allow easy access by external control circuitry that controls the ON-OFF statuses of the MOSFETs.

The power semiconductor device and package further include a gate and source/drain control voltage generated external to the semiconductor device and package. The package design allows a driver board to be placed in the closest proximity possible to the semiconductor device. Thus both the power circuit and the gate drive circuit have the lowest possible impedance.

Figure 2A:
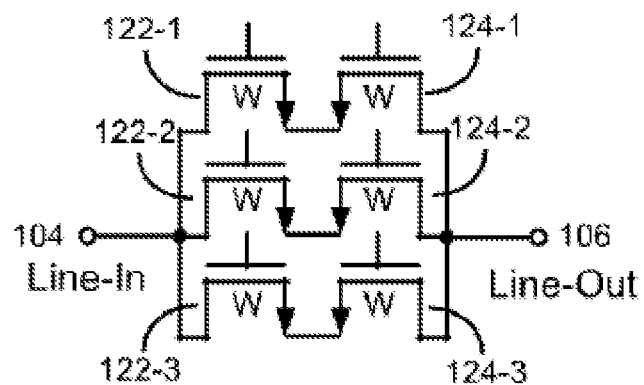
FIG. 2A is an electrical schematic that shows how the various SiC MOSFETs are electrically interconnected in accordance with an embodiment of the present disclosure.
Figure 2B:
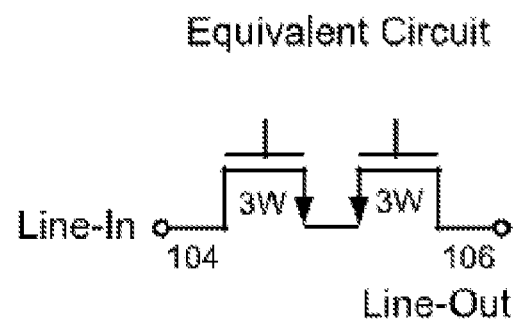
FIG. 2B is a schematic equivalent of FIG. 2A as two back-to-back SiC MOSFETs, each having a gate width W that is three times (3 W) the gate width of the individual SiC MOSFETs in accordance with an embodiment of the present disclosure.

FIG. 2A is an electrical schematic that shows how the various SiC MOSFETs 122-1, 122-2, 122-3, 124-1, 124-2 and 124-3 are electrically interconnected. Note that since the three SiC MOSFETs 122-1, 122-2 and 122-3 bonded to left top metal region 116 are connected in parallel and the SiC MOSFETs 124-1, 124-2 and 124-3 bonded to right top metal region 120 are also connected in parallel, the electrical schematic in FIG. 2A can be equivalently represented as depicted in FIG. 2B, in other words, as two back-to-back SiC MOSFETs, each having a gate width W that is three times (3 W) the gate width of the individual SiC MOSFETs represented in FIG. 2A.

The power semiconductor device package 100 offers a number of advantages over conventional power semiconductor packages designed and constructed for power converters. First, the conductive clips 108 not only serve as electrical connectors, they also serve as heat conductors that effectively transfer heat away from the top surfaces of the power semiconductor die 122-1/124-1, 122-2/124-2 and 122-3/124-3 to the central region 118 of the top metal layer 112. This heat is then conducted down into the thermally conductive ceramic middle layer 110 of the tri-layer substrate 102 and to the bottom metal layer 114, which can, if desired, be further attached to a baseplate and/or heatsink (not shown in the drawings).

By using the conductive clips 108, heat is therefore transferred away from both the source and drain sides of the SiC MOSFETs. In conventional power semiconductor die packaging approaches, bonding wires are used to connect the semiconductor die pads to source pads on the package substrate. However, because the bonding wires do not transfer heat, heat generated by the power semiconductor die can only be transferred away from the drain sides of the die.

Second, the conductive clips 108 have much larger cross sections than bonding wires. The large cross sections reduce $i^2R$ losses. Third, the line-in and line-out terminals 104 and 106 and their large thermal masses facilitate heat spreading and promote conduction of heat away from the power semiconductor die. Conventional power semiconductor die packaging does not include large line-in/line-out thermal masses. Instead, they rely exclusively on the relatively thin top metal layer of a DBC substrate to spread and transfer heat.

Fourth, the central region 120 of the top metal layer 112 is patterned, and the three rows of power semiconductor die 122-1/124-1, 122-2/124-2 and 122-3/124-3 are arranged, so that the conductive clips 108 do not overlap over their entire lengths L. In other words, the conductive clips 108 and rows of power semiconductor die 122-1/124-1, 122-2/124-2 and 122-3/124-3 are staggered. Staggering the power semiconductor die 122-1/124-1, 122-2/124-2 and 122-3/124-3 and conductive clips 108 results in distributing heat conductivity and a low horizontal thermal gradient (HTG), unlike in conventional power semiconductor die packaging where no staggering is used and a high HTG forms due to heat crowding. The disclosed staggered devices relative to an input and an output of the power semiconductor device and package also staggers a time delay and a heat conductivity delay through the multiple legs of the parallel devices.

Fifth, the large-thermal-mass line-in/line-out terminals 104 and 106, together with the AMB substrate 102 and jig-saw or stair case patterns formed by the trenches 121 that delineate the left, central and right regions 116, 118, and 120, result in a package assembly that is structurally sound. Conventional power semiconductor die packaging typically uses DBC substrates, which have much thinner top and bottom layers, small patterned sections with no jig-saw pattern, and do not include large thermal mass line-in/line-out terminals. Consequently, conventional power semiconductor die packaging is much more susceptible to thermal cycling vulnerabilities that strain (e.g. bend and/or twist) the package assembly, leading to die-substrate detachment vulnerabilities and metal layer debonding.

Sixth, because the conductive clips 108 are staggered and rigid in their construction, dynamic forces (LI**2/d) that can cause closely spaced bonding wires to short circuit or open due to fatigue are completely avoided.

Seventh, because bonding wires are not used in power semiconductor device package 100, inductive related losses and glitches are also avoided.

Eighth, the line-in and line-out terminals 104 and 106 include terminal projections 126 (as best shown in FIGS. 1A and 1D) that extend upward from the line-in and line-out major surfaces. The terminal projections 126 increase the thermal mass and surface area of the line-in and line-out terminals 104 and 106 and further facilitate heat spreading and efficacy of heat transfer away from the power semiconductor die 122-1/124-1, 122-2/124-2 and 123/124-3 and into the underlying ceramic (middle) layer 110. The terminal projections 126 also make installation of the power semiconductor device package 100 very easy through spring loaded female receptacles, similar to how an electrical plug is plugged into an electrical outlet-receptacle. In some embodiments, the in-out terminals (104-106) are modified to suit an air-gap (FIG. 3) at "in" (104, Line) and the spring-loaded receptacle out (106, Load). The load terminal is alternately clamped, instead of spring loaded, for reduced electrical contact resistance. In both cases, no screws are necessarily attached to the power semiconductor device.

In contrast, conventional power semiconductor device packages typically employ solder tabs or screws for installation, making them more difficult to install, especially in a panel board where space can be limited because matching terminal connections are not always easily accessible. The simple terminal projection/spring loaded female receptacle also makes removing the power semiconductor device package 100 very easy since there is no unscrewing or unsoldering required.

Ninth, the control circuitry that controls the gate-source voltages of the SiC MOSFETs 122-1/124-1, 122-2/124-2 and 123/124-3 is external to the power semiconductor device package 100, in other words, is both electrically and thermally decoupled from the power semiconductor device package 100. The thermal and electrical separation makes the gate control circuitry less vulnerable to any electromagnetic interference (EMI) that may be present in the power circuit.

Figure 3A:
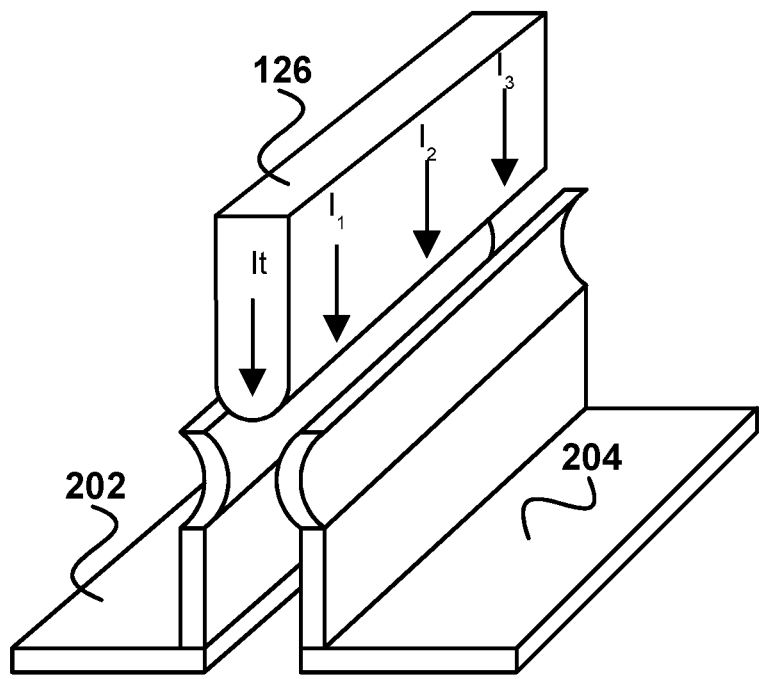
FIG. 3A is a pictorial representation of a power semiconductor current spreader and a terminal projection in accordance with an embodiment of the present disclosure.

FIG. 3A is a pictorial representation of a power semiconductor current spreader and a terminal projection in accordance with an embodiment of the present disclosure. A current spreader is configured to receive a terminal projection 126. A current spreader is engineered to make contact with a terminal projection on both sides thereof including 202 and 204 components and therefore increase a surface area for spreading current conduction and consequently for power dissipation. A current distributed across a terminal projection 126 is represented by It and I1, I2 and I3 as shown.

Figure 3B:
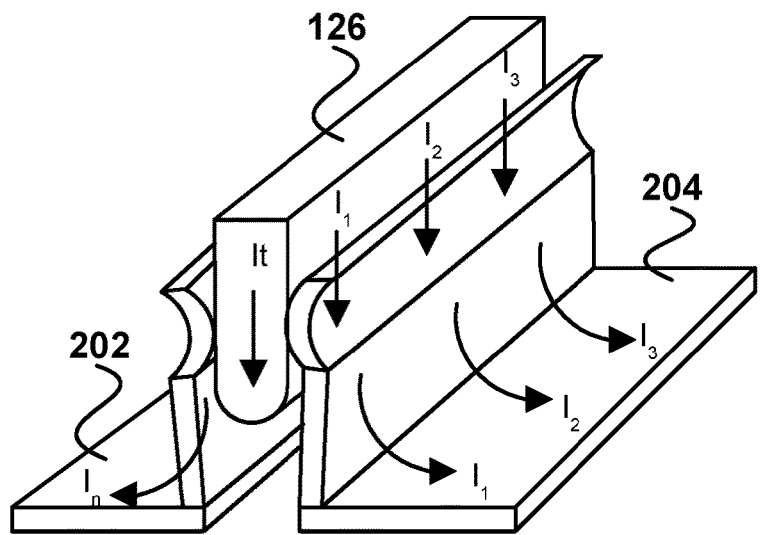
FIG. 3B is a pictorial representation of the power semiconductor current spreader receiving a terminal projection in accordance with an embodiment of the present disclosure.

FIG. 3B is a pictorial representation of the power semiconductor current spreader receiving a terminal projection in accordance with an embodiment of the present disclosure. Half of a total current It through the terminal projection 126 is spread across the current spreader 202 shown as currents I1, I2 and I3. The current It through the terminal projection 126 is also spread through current spreader 204 similarly as I4, I5 and I6 (not shown) and are thus through spreader 202 and 204 intrinsic resistances in parallel. The current spread for each of spreader 202 and 204 therefore can be represented by the following equation:

$$I\ \text{spreader} = It/2$$

Also, a total surface area of resistance also decreases the total resistance seen by the spread current. Resistances in parallel through the current spreaders 202 and 204 cut the resistance in half seen by the current It.

A power dissipation P=I*R therefore of the backplane and the current through the terminal projection is therefore $\frac{1}{4}^{th}$ the power of conventional art where a SSCB and package are screwed into a backplane.

Figure 3C:
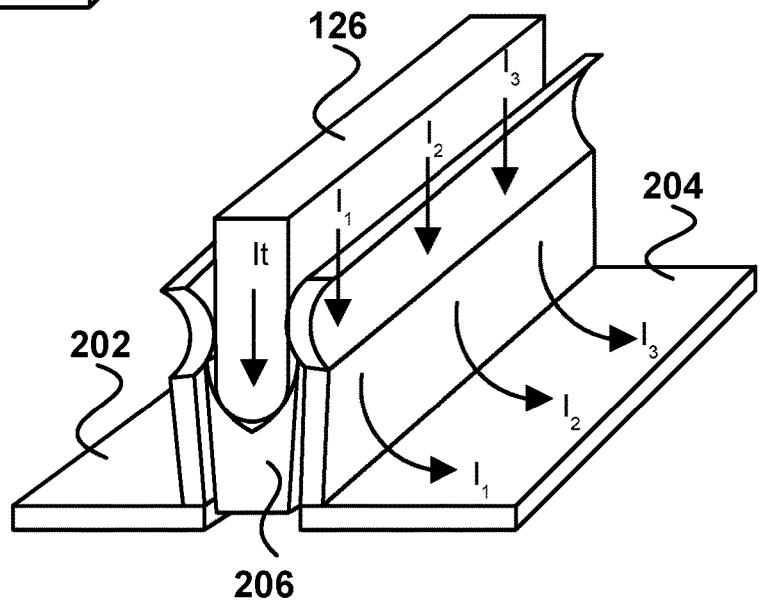
FIG. 3C is a pictorial representation of the power semiconductor current spreader before a composite ejection in accordance with an embodiment of the present disclosure.

FIG. 3C is a pictorial representation of the power semiconductor current spreader before a composite ejection in accordance with an embodiment of the present disclosure. A nylon composite ejector 206 is wedged between the terminal projections 126 and the current spreaders 202 and 204 and run a length thereof. The nylon composite extractor 206 is engineered to separate the terminal projection 126 from the current spreaders 202 and 204 so that there is no metal to metal friction on extraction. The nylon composite extraction tool contacts metal surfaces for extraction and has a much lower coefficient of friction that a metal to metal extraction operation. Therefore, the nylon composite ejector 206 enables in excess of 100 insertion and extraction cycles associated with an insertion force between 10 lbs and 20 lbs and an extraction force between 5 lbs and 10 lbs insertion force.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Notwithstanding specific embodiments of the invention have been described and illustrated, the invention is not to be limited to the specific forms or arrangements of parts so described and illustrated. The scope of the invention is to be defined by the claims and their equivalents included herein or by reference to a related application.

What is claimed is:

1. A power semiconductor device and package, comprising:
   a plurality of electrically parallel semiconductor device legs configured to share a line-in and line-out source regions and share a drain region between two devices in each leg, wherein each leg is laterally staggered from each other leg to distribute thermal conductivity across the shared source regions;
   a plurality of jigsaw patterned lateral isolation trenches in a substrate of the device, the trenches configured to isolate the laterally staggered line-in and line-out source regions from a common drain region of the plurality of semiconductor device legs; and
   a current spreader for each of the line-in and the line-out source regions, each current spreader configured to extend a length of the line-in and the line-out source regions and to increase a current conduction area there through.

2. The power semiconductor device and package of claim 1, further comprising a composite ejector wedged between the current spreader and the line-in and the line-out terminal projection.

3. The power semiconductor device and package of claim 1, further comprising thermally conductive vertical terminal projections configured to be received by spring loaded female receptacles.

4. The power semiconductor device and package of claim 1, wherein the substrate comprises a metal brazed metal to conductive ceramic to metal brazed metal sandwich including a silicon nitride.

5. The power semiconductor device and package of claim 1, further comprising a gate and source/drain control voltage generated external to the semiconductor device and package.

6. The power semiconductor device and package of claim 1, wherein a source portion of a semiconductor device leg is laterally adjacent a drain portion of another semiconductor device leg.

7. A power semiconductor device and package, comprising:
   a first semiconductor pair of devices configured between a first and a second source region and configured to share a drain region wherein a source portion of the first pair of devices is laterally adjacent a drain portion of a second pair of devices,
   wherein the first pair of devices is laid out laterally diagonal from the second pair of devices to distribute thermal conductivity relative to an input and an output of the device package;
   a plurality of stair case patterned lateral isolation trenches in a substrate of the package, the trenches configured to isolate the laterally diagonal source regions from a common drain region of the first and the second semiconductor pair of devices; and
   a current spreader for each of the first and the second source regions, each current spreader configured to extend a length of the first and the second source regions and to increase a current conduction area there through.

8. The power semiconductor device and package of claim 7, further comprising an integrated package including the substrate, a plurality of source, drain and gate terminals in conduction via a plurality of conductive clips.

9. The power semiconductor device and package of claim 7, further comprising thermally conductive vertical terminal projections configured to be received by spring loaded female receptacles.

10. The power semiconductor device and package of claim 7, wherein the substrate comprises an insulated metal substrate (IMS) and a metal brazed metal to conductive ceramic to metal brazed metal sandwich including a silicon nitride.

11. The power semiconductor device and package of claim 7, further comprising a gate and source/drain control voltage generated external to the semiconductor device and package.

12. The power semiconductor device and package of claim 7, wherein a source portion of the second semiconductor pair of devices is laterally adjacent a drain portion of a third semiconductor pair of devices.

13. The power semiconductor device and package of claim 7, wherein a source portion of the second semiconductor pair of devices is electrically isolated from the drain portion of a third semiconductor pair of devices by a stair case channel in the substrate.

14. A power semiconductor device and package system, comprising:
a first semiconductor pair of devices configured between a first and a second source region and configured to share a drain region laterally adjacent to a source portion of a second pair of devices,
wherein the first pair of devices is laid out in a staggered pattern from the second pair of devices to distribute thermal conductivity relative to an input and an output of the device package;
a plurality of stair case patterned lateral isolation trenches in a substrate of the package, the trenches configured to isolate a staggered source region from a common drain region of the first and the second semiconductor pair of devices; and
a current spreader for each of the first and the second source regions, each current spreader configured to extend a length of the first and the second source regions and to increase a current conduction area there through.

15. The power semiconductor device and package of claim 14, wherein a time delay from the package input to an output of the first pair of devices is shorter than a time delay from the package input to an output of the second pair of devices.

16. The power semiconductor device and package of claim 14, wherein a time delay from the package input to an output of the second pair of devices is shorter than a time delay from the package input to an output of the third pair of devices.

17. The power semiconductor device and package of claim 14, wherein a heat conductivity delay from the package input to an output of the first pair of devices is shorter than a heat conductivity delay from the package input to an output of the second pair of devices.

18. The power semiconductor device and package of claim 14, wherein a heat conductivity delay from the package input to an output of the second pair of devices is shorter than a heat conductivity delay from the package input to an output of the third pair of devices.

19. The power semiconductor device and package of claim 14, wherein a source portion of the second semiconductor pair of devices is laterally adjacent a drain portion of a third semiconductor pair of devices.

20. The power semiconductor device and package of claim 14, wherein a source portion of the second semiconductor pair of devices is electrically isolated from the drain portion of a third semiconductor pair of devices by a stair case channel in the substrate.

* * * * *